United States Patent [19]
Imai et al.

[11] Patent Number: 5,304,835
[45] Date of Patent: Apr. 19, 1994

[54] SEMICONDUCTOR DEVICE

[75] Inventors: Kaori Imai; Noboru Itomi, both of Suwa, Japan

[73] Assignee: Seiko Epson Corporation, Tokyo, Japan

[21] Appl. No.: 838,783

[22] PCT Filed: Jul. 11, 1991

[86] PCT No.: PCT/JP91/00935

§ 371 Date: May 18, 1992

§ 102(e) Date: May 18, 1992

[87] PCT Pub. No.: WO92/02044

PCT Pub. Date: Feb. 6, 1992

[30] Foreign Application Priority Data

Jul. 18, 1990 [JP] Japan .................................. 2-189681

[51] Int. Cl.$^5$ ...................... H01L 27/10; H01L 27/15
[52] U.S. Cl. .................................. 257/390; 257/401; 257/386
[58] Field of Search ........................ 365/185, 210, 390; 257/390, 391, 401, 400, 394, 386

[56] References Cited

U.S. PATENT DOCUMENTS 5,105,385   4/1992   Ohtsuka et al. ................. 365/185

FOREIGN PATENT DOCUMENTS

| 13747 | 2/1981 | Japan | 365/185 |
| 62-128558 | 6/1987 | Japan | 257/390 |
| 133958 | 5/1990 | Japan | 365/185 |
| 196462 | 8/1990 | Japan | 365/185 |

Primary Examiner—Jerome Jackson
Assistant Examiner—D. Monin
Attorney, Agent, or Firm—Eric B. Janofsky

[57] ABSTRACT

A semiconductor device comprising a memory cell matrix array wherein transistors formed on the outer edge of the memory cell matrix array are inferior in performance compared to the transistors comprising the operating memory cell matrix array because their transistor active regions shrink during semiconductor device fabrication. To avoid this problem, a dummy region is formed around the operating memory cell matrix array. The dummy region contains impurity regions formed at substantially the same density as the transistors comprising the operating memory cell matrix array. Thus, the transistors located on the outer edge of the operating memory cell matrix array function in the same manner as transistors formed within the operating memory cell matrix array. As a result, all the transistors of the operating memory cell matrix array have uniform performance.

21 Claims, 6 Drawing Sheets

SEMICONDUCTOR DEVICE

BACKGROUND OF THE INVENTION

1. Technical Field

The present invention relates to a semiconductor device in which memory cells comprising a plurality of MISFETs (metal-insulator-semiconductor FETs) are arranged in at least one dimension.

2. Background Art

The layout of a prior art memory cell matrix array 1 is shown in FIGS. 7–10. Memory cell matrix array 1 comprises a ROM (read-only memory) and is disposed on a semiconductor device 2. The information stored in the memory cell matrix array 1 is read out relative to activated word lines WL connected with a row decoder 3.

Figure 8:
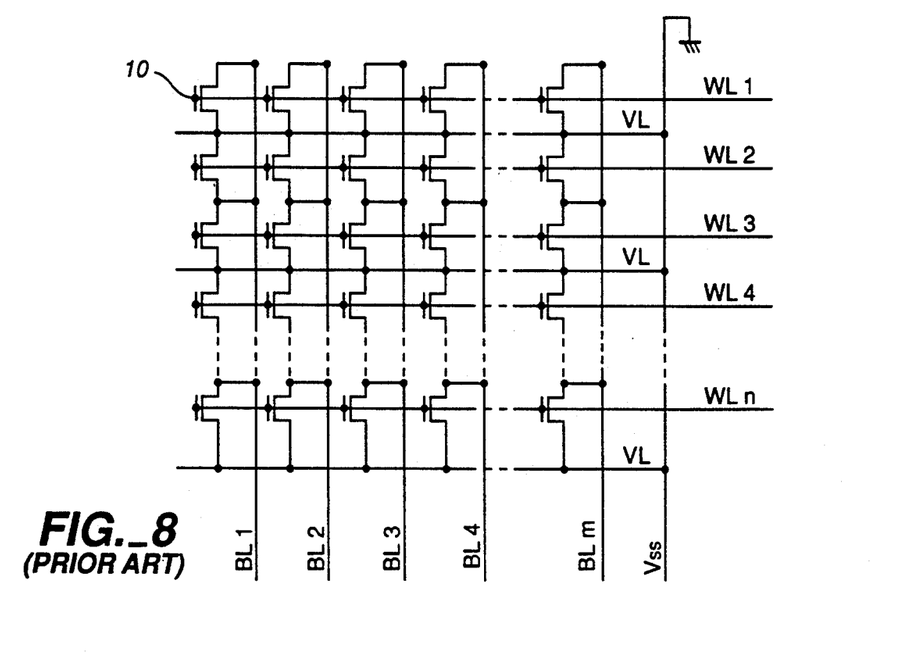
FIG. 8 is an equivalent circuit diagram of the memory cell matrix array shown in FIG. 7.

FIG. 8 shows the electrical circuit equivalent of memory cell matrix array 1. In matrix array 1, m N-channel MIS transistors 10 arranged along word lines WL constitute one row. N-channel MIS transistors 10 are arranged in parallel n rows. Thus, matrix array 1 comprises n rows and m columns. Word lines WL1–WLn are connected to the gates of the N-channel MIS transistors 10 of these rows. The drains of the N-channel MIS transistors 10 of each column are connected with respective bit lines BL1–BLm. The sources of the N-channel MIS transistors 10 of each row are common with the adjacent N-channel MIS transistors 10 of the same column. Power supply lines VL are connected to the transistor sources. As an example of operation, information stored in a particular N-channel MIS transistor (x, y) is caused to appear on a bit line BLy if the particular transistor (x, y) is activated by the word line WLx of the $x^{th}$ row.

Figure 7:
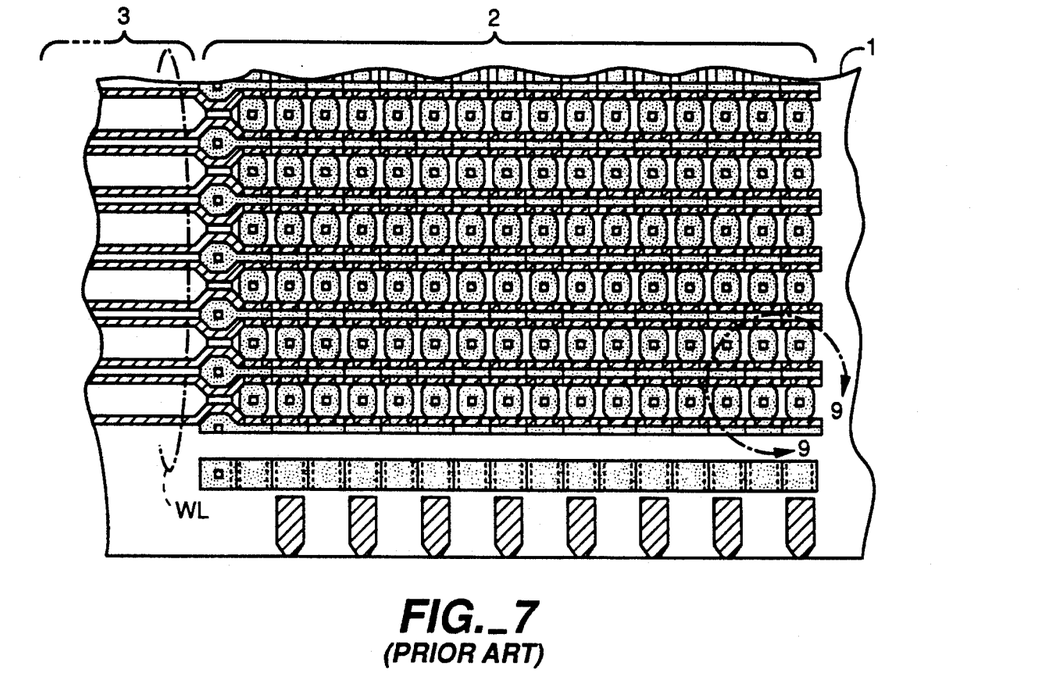
FIG. 7 is a partial horizontal cross section of a semiconductor device relating to prior art memory cells.
Figure 9:
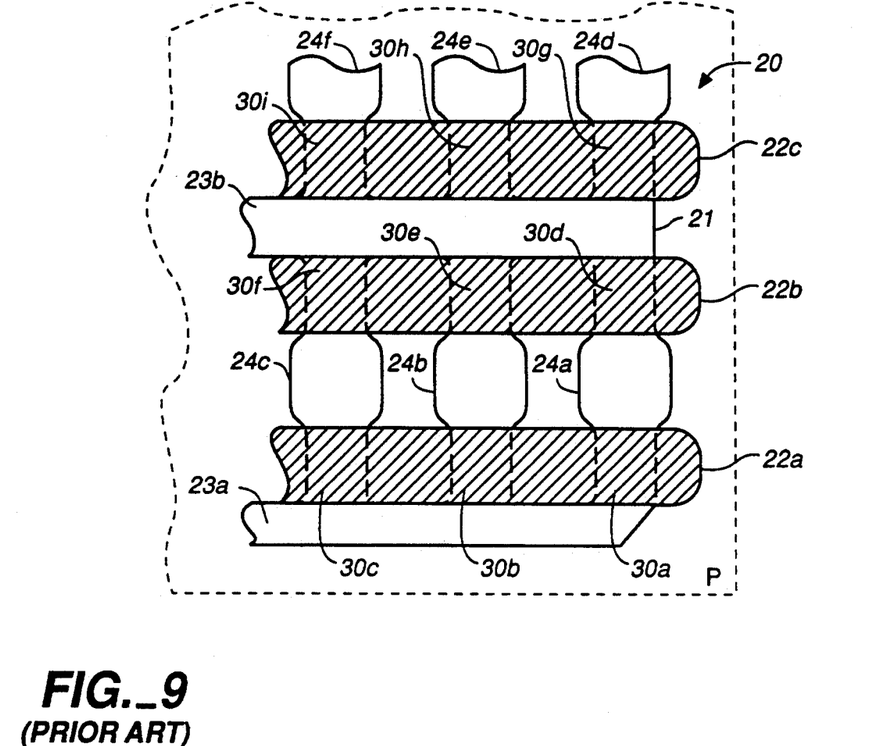
FIG. 9 is a fragmentary diagram of an end portion of the memory cell matrix array shown in FIG. 7.

FIG. 9 particularly shows an enlarged end portion identified at IX in FIG. 7 of memory cell matrix array 1. In the fabrication of memory cell matrix array 1, first p-type wells 20 are formed in a semiconductor substrate. Then, the active regions of the N-channel MIS transistors are determined and defined relative to their sources, drains and channel regions. Also, channel stop regions are determined. In the next step, a nitride film is formed over the entire surface of the substrate and patterned employing an element-separation mask, except relative to the transistor active regions. Then, boron is implanted into the laminate to increase the density of the p-type dopant. Then, the laminate is thermally treated at a high temperature for a long period of time. Consequently, the surfaces of the channel stop regions are oxidized excluding the transistor active regions 21 which are not protected by the nitride film.

Figure 10:
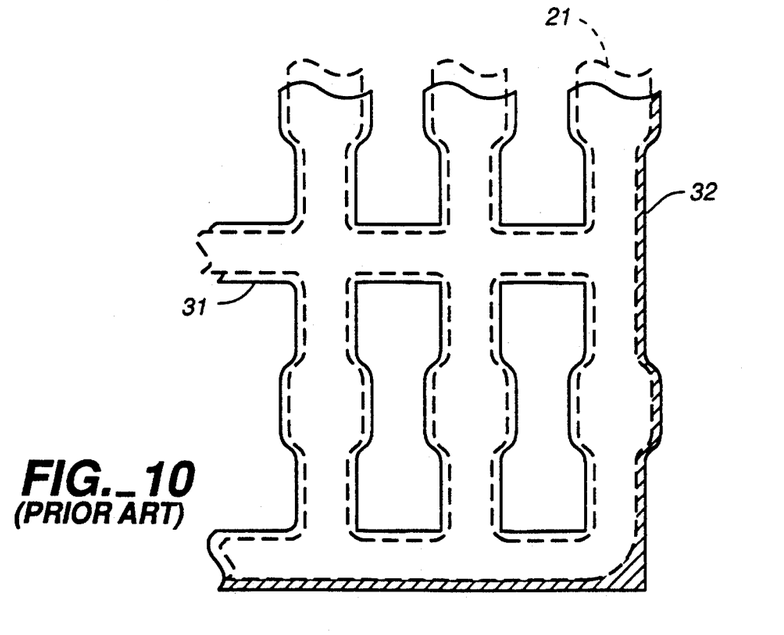
FIG. 10 is a fragmentary diagram in which the transistor active regions formed in the marginal portion of the memory cell matrix array shown in FIG. 9 are compared with design active regions.

In the next step, after the formation of the oxide film, the nitride film on transistor active regions 21 is removed to form a gate oxide film and and defined gate electrodes 22, such as, gate electrodes 22a, 22b, 22c shown in FIG. 10. Gate electrodes 22 function as a mask for the implantation of phosphorus into the transistor active regions 21 forming an n-type layer. In this manner, N-channel MIS transistors 30 are formed at the intersections of the active regions 21 and the gate electrodes 22.

Gate electrodes 22 (22a, 22b, 22c) are arranged horizontally to form rows as shown in FIG. 9. These rows constitute the word lines WL shown in FIG. 8. Transistor active regions 21 are parallel to gate electrodes 22, and form an n-type layer constituting sources 23 (23a, 23b, 23c) of N-channel MIS transistors 30. Active regions 21 of the n-type layer, which are located on opposite sides of gate electrodes 22 from sources 23 (23a, 23b, 23c) of N-channel MIS transistors 30, form drains 24 (24a, 24b, 24c) of N-channel MIS transistors 30. Sources 23 are common with N-channel MIS transistors 30 which are associated with gate electrodes 22 formed on the opposite side of sources 23. As an example, source 23b forms the sources of the N-channel MIS transistors 30d–30i associated with gate electrodes 22b and 22c. Drains 24 are common with N-channel MIS transistors 30 located on the opposite sides of the drains. For example, drain 24b forms the drains of N-channel MIS transistors 30b and 30e located on the opposite sides of drain 24b.

Attention is now directed to the ends of transistor active regions 21 forming the memory cells as previously described. Some end portions are illustrated in FIG. 10 and each consists of the active region forming sources 23a of N-channel MIS transistors 30a–30c and the active region forming the channels and the drains of N-channel MIS transistors 30a, 30d, 30g. These active regions are narrowed compared with other active regions. It is considered that various causes are responsible for these decreases in width in the active region, such as, thermal shrinkage of the resist on separation of the elements and instability of the flow of gas around the outer edge during the etching process. In any case, this phenomenon is inevitable to appear at the boundaries between the elements patterned at a high density and their surroundings patterned at a lower density, as in the case of a memory cell matrix array.

In manufacturing practice of forming transistor active regions 21, active regions indicated at crosshatched regions 32 in FIG. 10 are reduced in dimension for transistor active regions 31 shown in FIG. 10. For this reason, the N-channel MIS transistors formed along the outer edge of the memory cell array are inferior in performance compared to the N-channel MIS transistors formed within the memory cell array. For example, the active regions of N-channel MIS transistors 30a, 30d, and 30g formed along one end of the memory cell array are narrowed. Consequently, the channels in these N-channel MIS transistors are narrower than their intended design. In N-channel MIS transistors 30a, 30b, 30c where the transistor active regions forming the sources are narrowed, the resistance of the sources is increased. Therefore, the access time to N-channel MIS transistors 30a–30d and 30g is larger than the intended access time. It follows, therefore, that the access time to the memory cell matrix array is governed by the access time to the N-channel MIS transistors formed in these marginal portions of the memory cell array.

If a margin is added to the width of each transistor active region in order to obtain the intended access time to the N-channel MIS transistors formed along the outer edge, then the inner transistor active regions become excessively large reducing the packing density of the memory cells. Also, the parasitic capacitance in the N-channel MIS transistors is increased, because the distances among the memory cells are increased. Hence, the access time is increased to the memory cell matrix array.

SUMMARY OF THE INVENTION

In view of the foregoing problems, it is an object of the present invention to provide a semiconductor device comprising a memory cell matrix array in which the memory cell transistors arranged along the outer edge of the array are made to function as designed without affecting the arrangement of the memory cell transistors within the matrix array.

The present invention provides for a semiconductor device comprising a plurality of transistors arranged in at least one dimension to form a memory cell matrix array, the transistors being formed by patterning an impurity region. A dummy region for holding the shape of the patterned impurity region is formed outside the terminal regions of the transistors. As an example, at least some of the impurity regions in the dummy region can include at least a portion of the patterned impurity region and are formed in contiguous relationship with the impurity regions of the terminal transistors. In this case, the impurity regions in the dummy regions are employed as the terminals of the transistor active region. Thus, the transistors forming memory cells can be formed in and on the active region except for the shrunk region.

It is not necessary that this dummy region be an impurity region of the same type as the transistors of the array. It is only necessary that the dummy region be a patterned impurity region having substantially the same density as that of the transistors.

The impurity regions in the dummy region can be of a type different from the type of the impurity regions of the transistors forming the memory cells in the array. In this case, channel stop regions can be formed from the impurity regions in the dummy region. Also, it is possible to reduce the potential difference between the semiconductor substrate and the transistors by connecting power supply lines to the impurity regions in the dummy region.

The dummy region may further comprise MISFETs fabricated in the same way as the transistors forming the memory cells. Preferably, the MISFETs in the dummy region are not in contact or electrical communication with the transistors forming the cells. Where the MISFETs in the dummy region are connected with the transistors forming the cells, the effects of the FETs in the dummy region on the memory cells can be circumvented by maintaining the dummy region FETs in a cutoff condition or state during the operation of the connected transistors.

In one embodiment of the invention, each memory cell of the semiconductor device may be an N-channel MISFET capable of holding one bit of information. Preferably, the dummy region is formed from N-channel MISFETs, which are similar in arrangement and structure to the MISFETs forming the memory cells in the array. In this manner, the dummy region is formed by utilizing MISFETs similar to the MISFETs of the memory cells. In this case, the cells and the dummy region can be concurrently formed utilizing the same masking process. Consequently, the marginal portion of the cell matrix array, i.e., the boundary between the cell matrix array and the dummy region, is placed under the same conditional results as the inside regions of the cell matrix array. As a result, the MISFETs in the marginal portion of the cell matrix array can have the same performance as the inner MISFETs utilized in the memory cells of the array because both kinds of FETs are fabricated under the same conditions.

In this manner, the dummy region is formed at the end of the transistor active region where shrinkage often occurs. This assures that all the MISFETs forming the memory cells have uniform performance. Furthermore, the size of the dummy region can be easily adjusted according to the density of the patterned elements around the cell matrix array. Hence, a memory cell matrix array which comprises MISFETs having equal and uniform performance and with improved access time utilizing formed dummy regions of minimum required area.

Other objects and features of the invention will appear in the course of the description thereof which follows.

DESCRIPTION OF THE PREFERRED EMBODIMENTS

The best mode for carrying out the invention is now described by referring to the accompanying examples and the figures.

EXAMPLE 1

Figure 1:
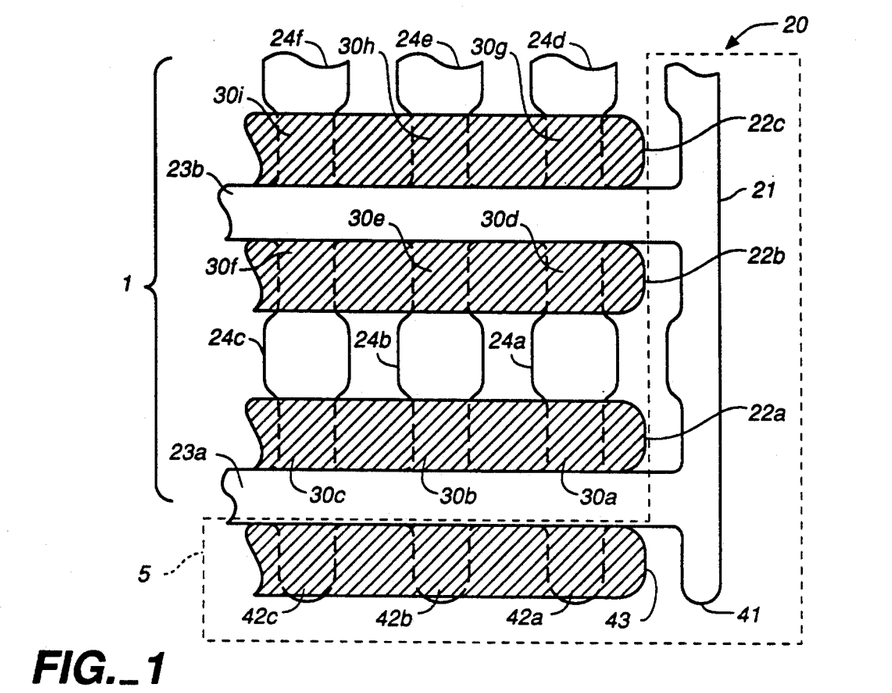
FIG. 1 is a fragmentary diagram of a semiconductor device comprising a memory cell matrix array together with a dummy region formed outside the array fabricated in accordance with the invention.

Referring to FIG. 1, a layout at an end of a memory cell matrix array according to the invention is illustrated. An impurity region is formed around the memory cell matrix array 1 to form a dummy region 5. The pattern essential for active regions 21 forming the memory cells is extended to the impurity region. In this example, a semiconductor device is composed of a region forming memory cell matrix array 1 and transistor active regions 21 formed outside array 1. Active regions 21 comprise a vertical region 41 perpendicular to sources 23a and 23b together with regions 42a-42c located on the opposite side of source 23a from N-channel MIS transistors 30a-30c. In other words, additional active regions 21 are added to the active region forming the memory cell matrix region. N-channel MIS transistors 30a-30i formed by transistor active regions 21 and gate electrodes 22a-22c are the same as those of memory cell matrix array 1 previously described in connection with FIGS. 7-10 so that like components are indicated by like reference numerals in the figures throughout the disclosure and will not be further described.

The process for manufacturing the semiconductor device of this invention is similar to the process for manufacturing the semiconductor device of the prior art except that the outer regions 41, 42a–42c comprising dummy region 5 are added to memory cell matrix array 1. These outer regions function as transistor active region 21. Therefore, when p-type wells 20 are formed, memory cell matrix array 1 is patterned to include dummy region 5 via a mask for separating the defined elements. Following this patterning step, an oxide film is formed on the surface in the same manner as in the conventional process. Phosphorus is then implanted into the transistor active regions employing the gate electrodes as a mask. As a result, an n-type layer is formed. This patterning step is followed by the etching step wherein the transistor active regions are narrowed on the outer edge of the element-separating mask as previously explained. However, in this example, the marginal portion where the active regions are narrowed comprises dummy region 5. Therefore, in the region where N-channel MIS transistors 30a–30i are formed, active regions 21 of MIS transistors forming the memory cells have the same designed width. Consequently, the widths of the channels and the sources of N-channel MIS transistors 30a–30d and 30g located outside memory cell matrix array 1 are made coincident with the designed values, in the same manner as the inner N-channel MIS transistors, such as, for example, inner N-channel MIS transistor 30e. In other words, the channels and the sources of outer N-channel MIS transistors 30a–30d, and 30g have the intended widths in the same manner as the inner N-channel MIS transistors, such as, for example, inner N-channel MIS transistor 30e. As a result, the performance of the outer transistors will not deteriorate and, correspondingly, the performance, including the access time, of the memory cell matrix array is not governed by the outer formed N-channel MIS transistors. This assures that every N-channel MIS transistor has the intended performance.

In this example, a dummy electrode 43 is formed on top of impurity regions 42a–42c in dummy region 5 in order to avoid a reduction in the width of the electrodes in the marginal portion of the transistor active regions.

Figure 2:
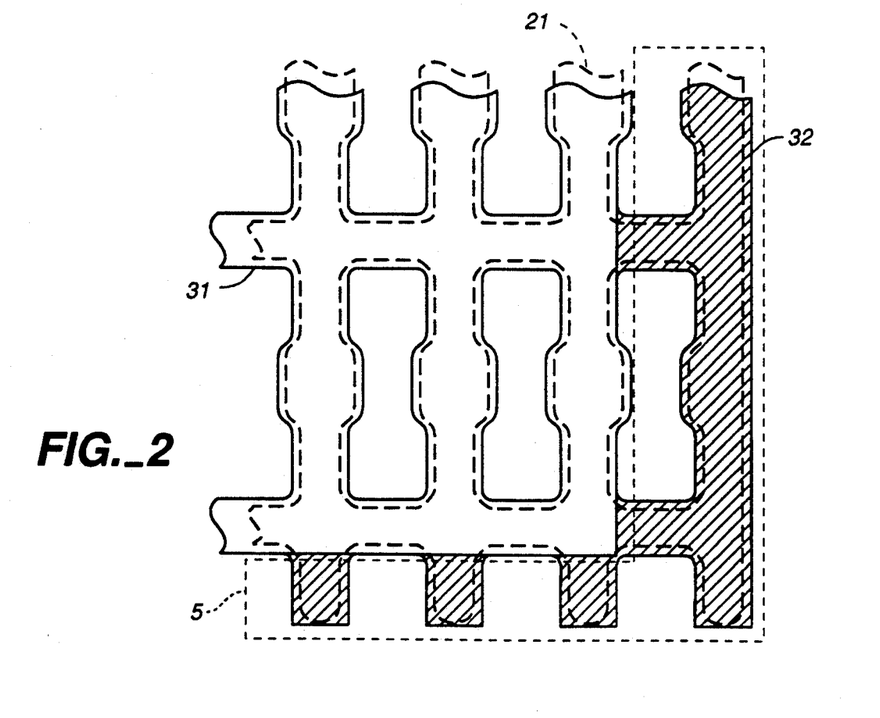
FIG. 2 is a fragmentary diagram in which the transistor active region of the memory cell matrix array shown in FIG. 1 is compared with the designed active region.

Referring to FIG. 2, transistor active regions 21 described above are compared with designed active regions 31. As can be seen from this figure, active regions 21 have a narrowed region 32 on the outer edge as compared with designed active region 31. This narrowed region 32 is contained, however, within dummy region 5. In memory cell matrix array 1, therefore, the intended active regions are secured.

In the present example, the impurity regions in dummy region 5 are of n-type and the same as the impurity regions in the memory cells. The impurity regions in the dummy region may be doped p-type. In this case, power supply lines can be connected with the impurity regions to reduce the potential difference with the p-type wells.

EXAMPLE 2

Figure 3:
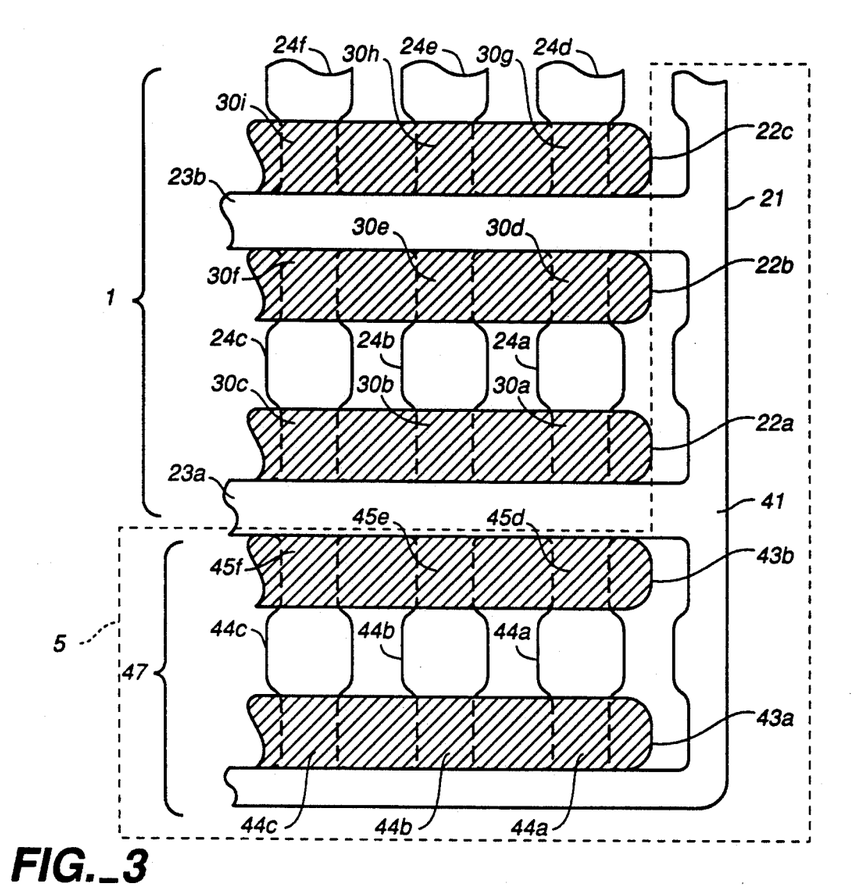
FIG. 3 is a fragmentary diagram of another semiconductor device comprising a memory cell matrix array and dummy transistors formed outside the array fabricated in accordance with the invention.

Referring to FIG. 3, there is illustrated an end portion of another memory cell matrix array according to this invention. Also, in this example, an impurity region comprising a dummy region 5 is formed around memory cell matrix array 1. The impurity region is patterned in the same manner as the essential pattern for memory cell matrix array 1. In dummy region 5, however, dummy MIS transistors are formed by an active region 47 and gate electrodes 43a, 43b at one end as viewed in the direction of the bit lines of the memory cell matrix array 1.

In the present example, transistor active regions 21 forming memory cell matrix array 1 and dummy region 5 include a vertical region 41 and active region 47 in addition to the conventional active regions forming cell matrix array 1. Vertical region 41 is perpendicular to sources 23a and 23b. Active region 47 is of the same type as the active regions forming the N-channel MIS transistors 30a–30f of cell matrix array 1. Active region 47 is formed on the opposite side of source 23a from MIS transistors 30a–30c. As a result, that portion of the active region which is narrowed is contained within dummy region 5. This permits the outer N-channel MIS transistors formed in the marginal portion of cell matrix array 1 to have their intended performance. Inner N-channel MIS transistors 30a–30i of memory cell matrix array 1 are identical in configuration with the memory cells in FIGS. 8–10.

Thus, this example is characterized in that dummy MIS transistors 45a–45f are formed by active region 47 in dummy region 5 in combination with gate electrodes 43a and 43b. It is desired to form dummy region 5 wide in order to remove any effects as much as possible of the termination of the active regions on the N-channel MIS transistors within memory cell matrix array 1. In the present example, dummy MIS transistors which are similar in structure to the N-channel MIS transistors forming the memory cell matrix array 1 are formed in dummy region 5 to obtain a sufficient width of dummy region 5 in parallel with word lines WL at right angles to the direction of the bit lines BL of cell matrix array 1. Dummy region 47 where the dummy MIS transistors are formed is quite effective in improving the structure of the mask pattern as well as shortening the time taken to fabricate the device. However, when the gate electrodes of the dummy MIS transistors in this region, i.e., the word lines DL of the MIS transistors formed in the dummy region, are activated, there is a possibility that signals are applied to the bit lines either due to the information inadvertently stored in the dummy MIS transistors or via the dummy MIS transistors. Accordingly, in this example, gate electrodes 43a and 43b of dummy MIS transistors 45a–45f are grounded to drive dummy MIS transistors 45a–45f to a maintained off condition, as shown in FIG. 4.

Figure 4:
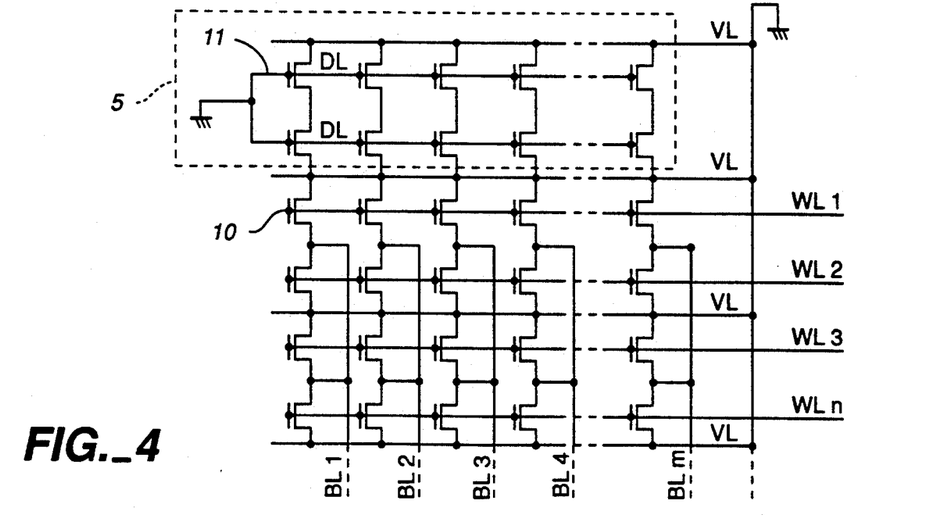
FIG. 4 is an equivalent circuit diagram of the memory cell matrix array shown in FIG. 3.

FIG. 4 shows an equivalent circuit for this example. Dummy MIS transistors 11 are connected in parallel with the N-channel MIS transistors 10 forming the memory cells of array 1. Since the gate electrodes of dummy MIS transistors 11 are grounded via their respective word lines DL, dummy MIS transistors 11 are maintained in a cutoff state.

EXAMPLE 3

Figure 5:
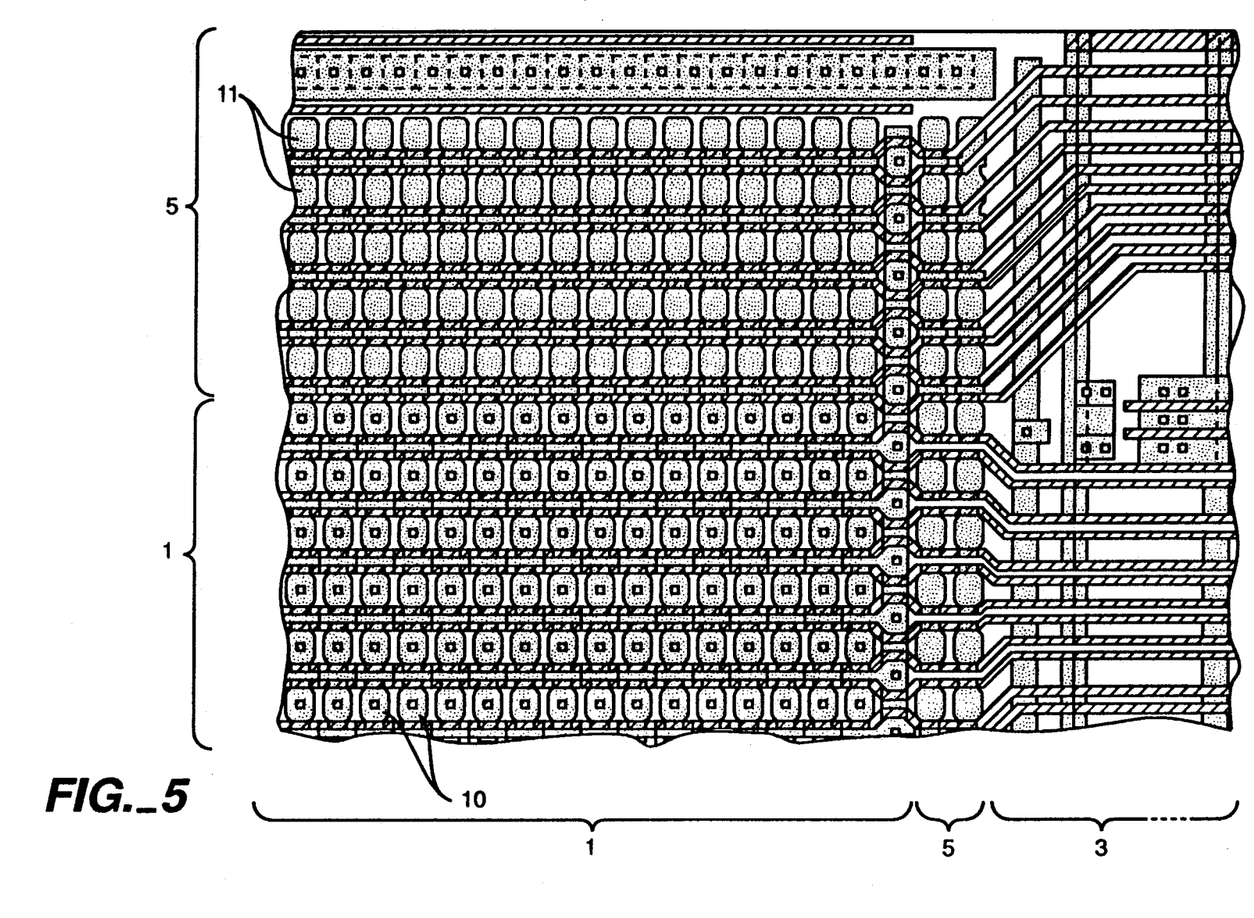
FIG. 5 is a partial horizontal cross section of a semiconductor device comprising memory cells together with dummy transistors according to this invention.

Reference is now made to FIG. 5 wherein there is shown the layout of a semiconductor device having a further memory cell matrix array according to this invention. In this example, 9 rows of dummy MIS transistors 11 are disposed parallel to the word lines WL of memory cell matrix array 1 and spaced from each other in the direction of bit lines BL of memory cell matrix array 1. Also, two columns of dummy MIS transistors 11 which are spaced from each other in the direction of word lines WL of memory cell matrix array 1 are disposed parallel to the bit lines BL. Word lines WL of cell matrix array 1 pass through the two columns of dummy MIS transistors to a row decoder. The drain of each dummy MIS transistor 11 has no electrode. Dummy MIS transistors 11 are not connected with bit lines BL.

In the present example, the 9 rows of dummy MIS transistors 11 are disposed in the marginal portion of the semiconductor device where the high packing density of the patterned essential memory cells decreases significantly. This assures the highest performance of the N-channel MIS transistors 10 inside the memory cell matrix array 1. On the other hand, only two columns of dummy MIS transistors 11 are disposed in the direction of the row decoder in which the high density of the elements does not vary significantly. In this manner, the performance of N-channel MIS transistors 10 is assured while retaining as much as possible the packing density of the semi-conductor device.

Figure 6:
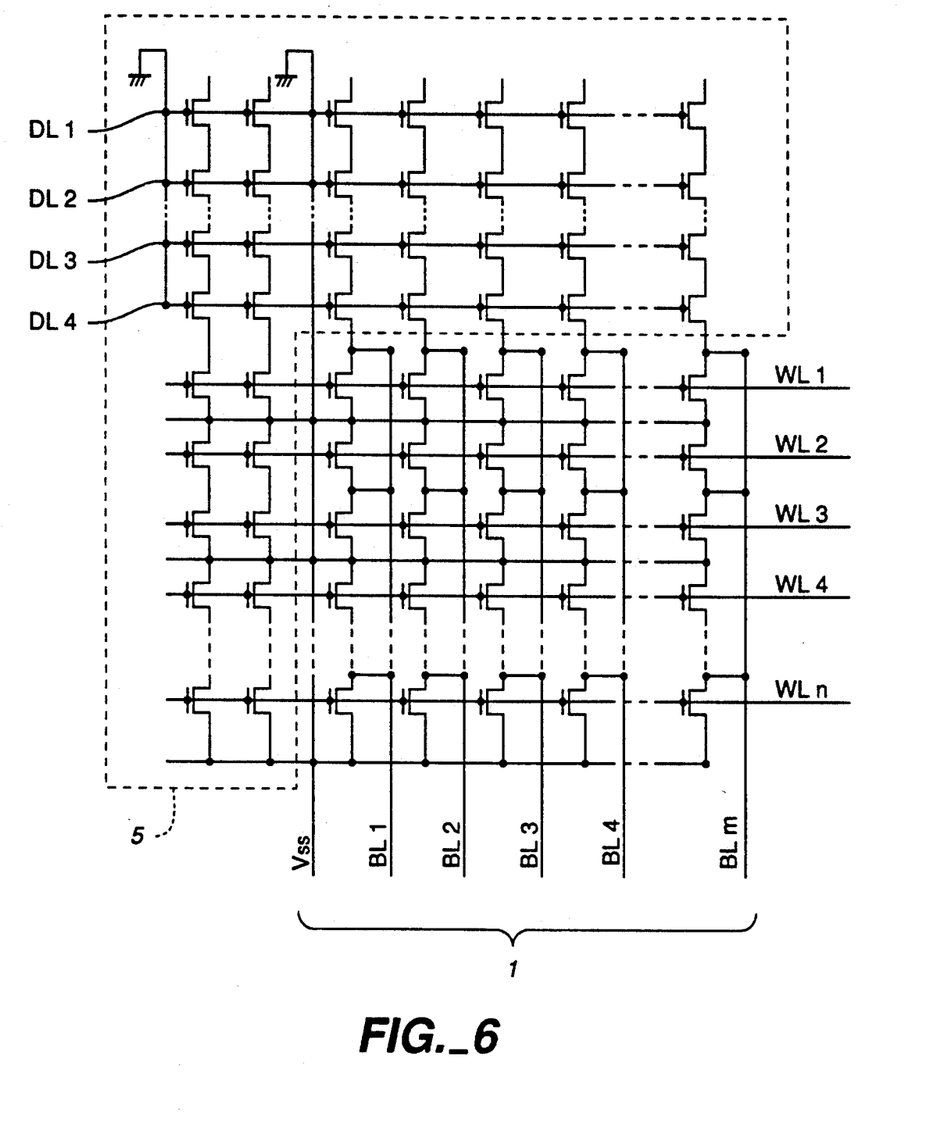
FIG. 6 is an equivalent circuit diagram of the memory cells shown in FIG. 5.

FIG. 6 shows the equivalent circuit of memory cell matrix array 1 and dummy region 5 for FIG. 5. The gate electrodes of the 9 rows of dummy MIS transistors 11 formed parallel to word lines WL are grounded via word lines DL in dummy region 5. These dummy MIS transistors 11 are maintained in a cutoff state. On the other hand, the two columns of dummy MIS transistors 11 disposed parallel to bit lines BL are connected with word lines WL of the rows, in the same manner as N-channel MIS transistors 10 within memory cell matrix array 1. When any one row is read, the dummy MIS transistor adjacent to that row is biased off in the same manner as the N-channel MIS transistors inside memory cell matrix array 1 so that reading of information from the memory cells is not affected.

In this example, the dummy MIS transistors similar to the N-channel MIS transistors are arranged outside memory cell matrix array 1. Dummy MIS transistors 11 and the N-channel MIS transistors of array 1 can be concurrently fabricated in the same process step. Therefore, it is possible to fabricate the N-channel MIS transistors of the memory cells on the inner side of the dummy region where the active regions are fabricated as designed, by forming the transistor active regions including the dummy MIS transistors and by forming the outer portion as the dummy region, wherein the outer portion is susceptible to the effects of shrinkage. The arrangement of the dummy region makes it possible to render the widths of the channels, the sources, and the drains of the N-channel MIS transistors formed in the margin portion of the memory cell matrix array equal to the designed values. Hence, in the present example, the N-channel MIS transistors in the marginal portion of the memory cell matrix array can have the same performance as that of the inner N-channel MIS transistors. As a consequence, the intended performance of the inner N-channel MIS transistors can be achieved without being affected by the performance of the MIS transistors formed in the marginal portion. The access time of the cell matrix array can, therefore, be improved.

In this example, the 9 rows of dummy MIS transistors are disposed in the marginal portion of the semiconductor device, and two columns of dummy MIS transistors are arranged in the direction of the row decoder. In this manner, the dummy region can be tailored to the circumstances surrounding the memory cells, i.e., the size of the dummy region can be adjusted according to the circumstances surrounding the memory cells. This makes it unnecessary to provide for a large area for the memory cell matrix array. Therefore, it is not necessary to extend the region required for all the N-channel MIS transistors to improve the performance of the N-channel MIS transistors in the marginal portion as in the case of the prior art memory cell matrix array. Therefore, the performance of the memory cell matrix array can be improved while minimizing the extent of area coverage.

As described above, the present invention can be applied to semiconductor devices in which a dummy region is utilized and in which transistors formed in array in the device are provided to have uniform performance. Examples of such arrays are RAMs, sense amplifiers, shift registers and ROMs. Moreover, this invention is applicable to circuits requiring uniform access time and self-redundancy check.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor device having a plurality of transistors arranged at least along one dimension, said transistors being formed by patterning of a first plurality of impurity regions, said semiconductor device comprising a dummy region for holding the shape of said patterned impurity region, said dummy region being formed adjacent to and outside terminal regions of said transistors, wherein a second plurality of impurity regions are formed in said dummy region at substantially the same impurity density as that of said first plurality of impurity regions and wherein at least a portion of said second plurality of impurity regions is of a conductivity type different from the conductivity type of said first plurality of impurity regions.

2. The semiconductor device of claim 1 wherein dummy transistors are formed by at least some of said second plurality of impurity regions in said dummy region to be equivalent to said terminal region transistors, and wherein said dummy transistors are maintained in a cutoff state during the operation of said terminal region transistors.

3. The semiconductor device of claim 1 wherein dummy transistors equivalent to the terminal transistors are formed in at least a portion of said second plurality of impurity regions in said dummy region, and wherein the outputs of said dummy transistors are not in electrical communication with the outputs of the transistors formed by patterning said impurity region transistors.

4. The semiconductor device of claim 3 wherein dummy transistors are formed in at least a portion of said second plurality of impurity regions in said dummy region to be equivalent to said terminal region transistors, and wherein said dummy transistors are maintained in a cutoff state during the operation of said terminal region transistors.

5. The semiconductor device of claim 1 wherein dummy transistors are formed in at least a portion of said second plurality of impurity regions in said dummy region to be equivalent to said terminal region transistors, and wherein said dummy transistors are maintained in a cutoff state during the operation of said terminal region transistors.

6. The semiconductor device of claim 5 wherein dummy transistors equivalent to the terminal transistors are formed in at least a portion of said second plurality of impurity regions in said dummy region, and wherein the outputs of said dummy transistors are not in electrical communication with the outputs of the transistors formed by patterning said first plurality of impurity region transistors.

7. The semiconductor device of claim 6 wherein dummy transistors are formed in at least a portion of said first plurality of impurity regions in said dummy region to be equivalent to said terminal region transistors, and wherein said dummy transistors are maintained in a cutoff state during the operation of said terminal region transistors.

8. The semiconductor device of claim 1
wherein at least a portion of said second plurality of impurity regions in said dummy region include at least a portion of said first plurality of impurity region and are contiguous with said second plurality of impurity regions of said terminal region transistors.

9. The semiconductor device of claim 8 wherein dummy transistors equivalent to the terminal transistors are formed in at least a portion of said second plurality of impurity regions in said dummy region, and wherein the outputs of said dummy transistors are not in electrical communication with the outputs of the transistors formed by patterning said second plurality of impurity regions.

10. The semiconductor device of claim 8 wherein dummy transistors are formed by at least some of said second plurality of impurity regions in said dummy region to be equivalent to said terminal region transistors, and wherein said dummy transistors are maintained in a cutoff state during the operation of said terminal region transistors.

11. The semiconductor device of claim 8 wherein at least a portion of said second plurality of impurity regions are of a conductivity type different from the conductivity type of said second plurality of impurity regions forming said terminal region transistors.

12. The semiconductor device of claim 11 wherein dummy transistors are formed in at least a portion of said second plurality of impurity regions in said dummy region to be equivalent to said terminal region transistors, and wherein said dummy transistors are maintained in a cutoff state during the operation of said terminal region transistors.

13. The semiconductor device of claim 11 wherein dummy transistors equivalent to the terminal transistors are formed in at least a portion of said second plurality of impurity regions in said dummy region, and wherein the outputs of said dummy transistors are not in electrical communication with the outputs of the transistors formed by patterning said first plurality of impurity regions.

14. The semiconductor device of claim 13 wherein dummy transistors are formed in at least a portion of said second plurality of impurity regions in said dummy region to be equivalent to said terminal region transistors, and wherein said dummy transistors are maintained in a cutoff state during the operation of said terminal region transistors.

15. The semiconductor device of claim 1 wherein said transistors comprise MISFETs.

16. The semiconductor device of claim 15 wherein each of said MISFETs is an N-channel MISFET capable of holding one bit of information.

17. A semiconductor device comprising:
a memory cell array formed by a plurality of MISFETs arranged in at least one dimension; and
at least one column of dummy MISFETs formed outside the memory cell array, each dummy MISFETs being substantially identical in pattern structure with each of said plurality of MISFETs wherein a plurality of impurity regions are formed in said one column of dummy MISFETs at substantially the same impurity density as that of said plurality of MISFETs and wherein at least a portion of said plurality of impurity regions is of a conductivity type different from the conductivity type of said plurality of MISFETs.

18. The semiconductor device of claim 17 wherein at least some of said dummy MISFETs have gate electrodes maintaining them in a cutoff state.

19. The semiconductor device of claim 17 wherein outputs of said dummy MISFETs do not interfere with outputs of said plurality of MISFETs.

20. The semiconductor device of claim 19 wherein at least some of said dummy MISFETs have gate electrodes maintaining them in a cutoff state.

21. The semiconductor device of any one of claims 17-20 wherein each of said plurality of MISFETs is an N-channel MISFET capable of holding one bit of information, said memory cell array comprising a ROM.

* * * * *